US007098928B2

United States Patent
Ono

(10) Patent No.: US 7,098,928 B2
(45) Date of Patent: Aug. 29, 2006

(54) CODE PROCESSING CIRCUIT

(75) Inventor: Shinji Ono, Mishimi (JP)

(73) Assignees: Kabushiki Kaisha Toshiba, Tokyo (JP); Toshiba Tec Kabushiki Kaisha, Tokyo (JP)

( * ) Notice: Subject to any disclaimer, the term of this patent is extended or adjusted under 35 U.S.C. 154(b) by 125 days.

(21) Appl. No.: 10/743,497

(22) Filed: Dec. 23, 2003

(65) Prior Publication Data

US 2005/0134487 A1    Jun. 23, 2005

(51) Int. Cl.
*G09G 5/02* (2006.01)
*G06K 9/36* (2006.01)
*H03M 7/46* (2006.01)

(52) U.S. Cl. .................. 345/605; 382/166; 341/63

(58) Field of Classification Search ................ 345/605; 382/166; 341/63
See application file for complete search history.

(56) References Cited

U.S. PATENT DOCUMENTS 5,301,032 A * 4/1994 Hong et al. ................. 382/250
5,886,652 A * 3/1999 Adachi et al. ............... 341/67
2003/0025709 A1 * 2/2003 Kim et al. ................... 345/589

FOREIGN PATENT DOCUMENTS

| JP | 5-022156 A | 1/1993 |
| JP | 5-130429 A | 5/1993 |
| JP | 6-113142 A | 4/1994 |

* cited by examiner

*Primary Examiner*—Kee M. Tung
*Assistant Examiner*—Aaron M. Richer
(74) *Attorney, Agent, or Firm*—Foley & Lardner LLP

(57) ABSTRACT

A code processing circuit includes a plurality of coders which encode different kinds of data, respectively, a first buffer which stores the codes outputted from the coders provided corresponding to the plurality of coders, a second buffer which stores the lengths of the codes outputted from the coders provided corresponding to the plurality of coders, a first adder which adds the code lengths stored in the second buffer provided corresponding to the plurality of coders, a second adder which adds all the code lengths added in the first adder, and an adjustment unit which adjusts an output code by the unit of 1 bit based on the codes stored in the first buffer, the code lengths stored in the second buffer and the code lengths added in the second adder.

1 Claim, 4 Drawing Sheets

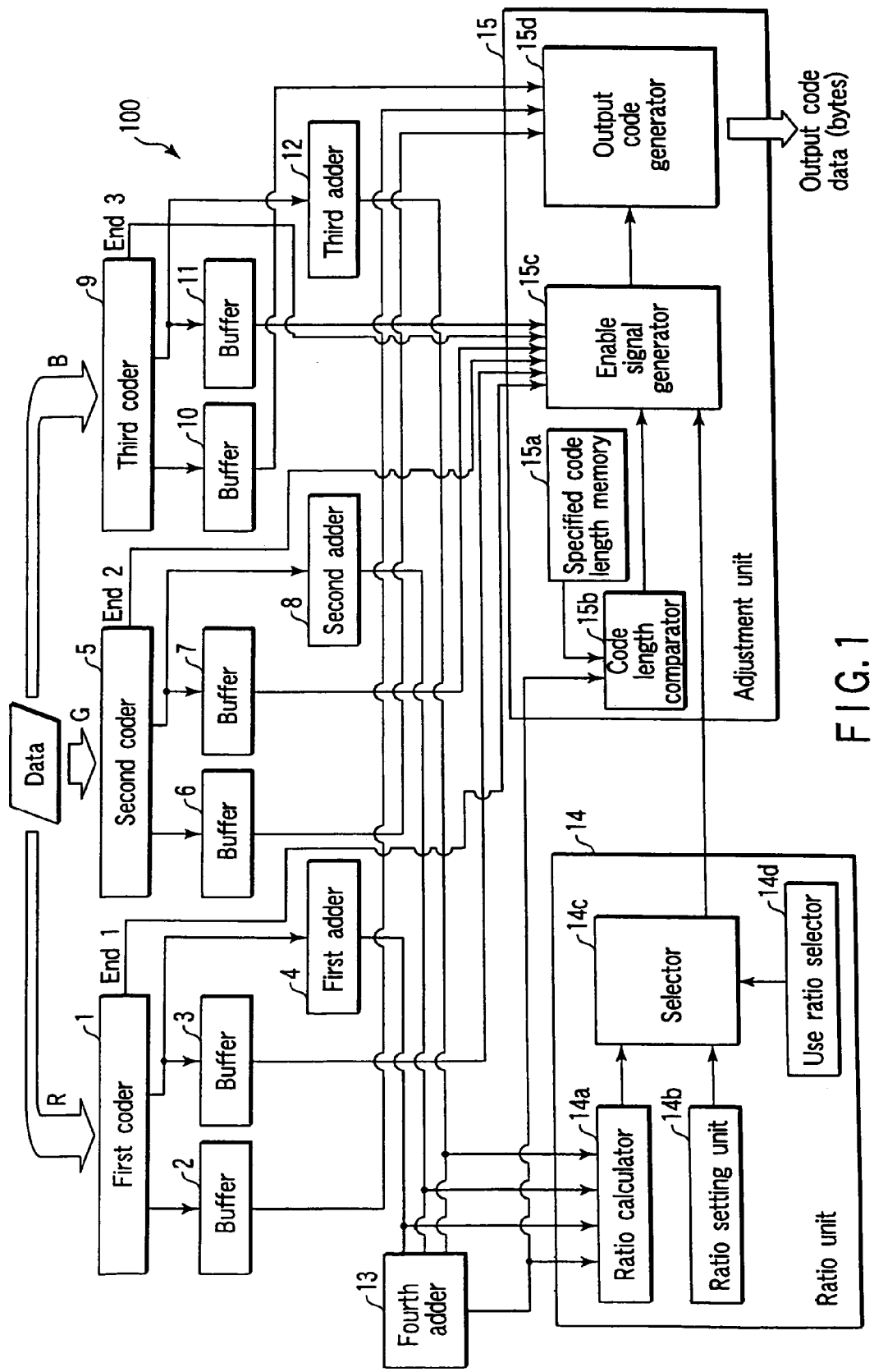
F I G. 1

|  | R-code (180 bits) | G-code (60 bits) | B-code (310 bits) |
|---|---|---|---|
| ⋮ | ⋮ | ⋮ | ⋮ |
| N-6th | 7 bits | 8 bits | 9 bits |
| N-5th | 4 bits | 5 bits | 12 bits |
| N-4th | 6 bits | 10 bits | 5 bits |
| N-3rd | 13 bits | 3 bits | 8 bits |
| N-2nd | 9 bits | 8 bits | 4 bits |
| N-1st | 4 bits | 6 bits | 8 bits |
| Nth | 10 bits | 7 bits | 3 bits |

CODE PROCESSING CIRCUIT

BACKGROUND OF THE INVENTION

1. Field of the Invention

The present invention relates to a code processing circuit which processes codes.

2. Description of the Related Art

In a conventional code processing circuit, to output coded data items sequentially, the length of each code must be adjusted to the number of output bits. Namely, to output having a code length of 27 bits, in units of 8 bits (1 byte), 5-bit dummy data is added to the coded data.

A plurality of coded data may exist in output data as described above, though the length of data is reduced by coding. In this case, the code is adjusted to the data length divisible by the number of output bits, by adding dummy data, to simplify the process of adjusting each code. Thus, the output data length increases over the coded data length. Besides, the length of each code length of such data becomes unknown when the code is cut off. Inevitably, optimum code cut-off is impossible.

Therefore, there is a need for a code processing circuit that can output a code by adjusting the unit of output bits.

BRIEF SUMMARY OF THE INVENTION

According to an aspect of the present invention, there is provided a code processing apparatus comprising a plurality of coders which encode different kinds of data, respectively; a first buffer which stores the codes outputted from the coders provided corresponding to the plurality of coders; a second buffer which stores the lengths of the codes outputted from the coders provided corresponding to the plurality of coders; a first adder which adds the code lengths stored in the second buffer provided corresponding to the plurality of coders; a second adder which adds all the code lengths added in the first adder; and an adjustment unit which adjusts an output code by the unit of 1 bit based on the codes stored in the first buffer, the code lengths stored in the second buffer and the code lengths added in the second adder.

Objects and advantages of the invention will become apparent from the description which follows, or may be learned by practice of the invention.

BRIEF DESCRIPTION OF THE SEVERAL VIEWS OF THE DRAWING

The accompanying drawings illustrate embodiments of the invention, and together with the general description given above and the detailed description given below, serve to, explain the principles of the invention.

FIG. 1 is a diagram showing a configuration of a code processing circuit in one embodiment of the present invention;

DETAILED DESCRIPTION OF THE INVENTION

Figure 2:
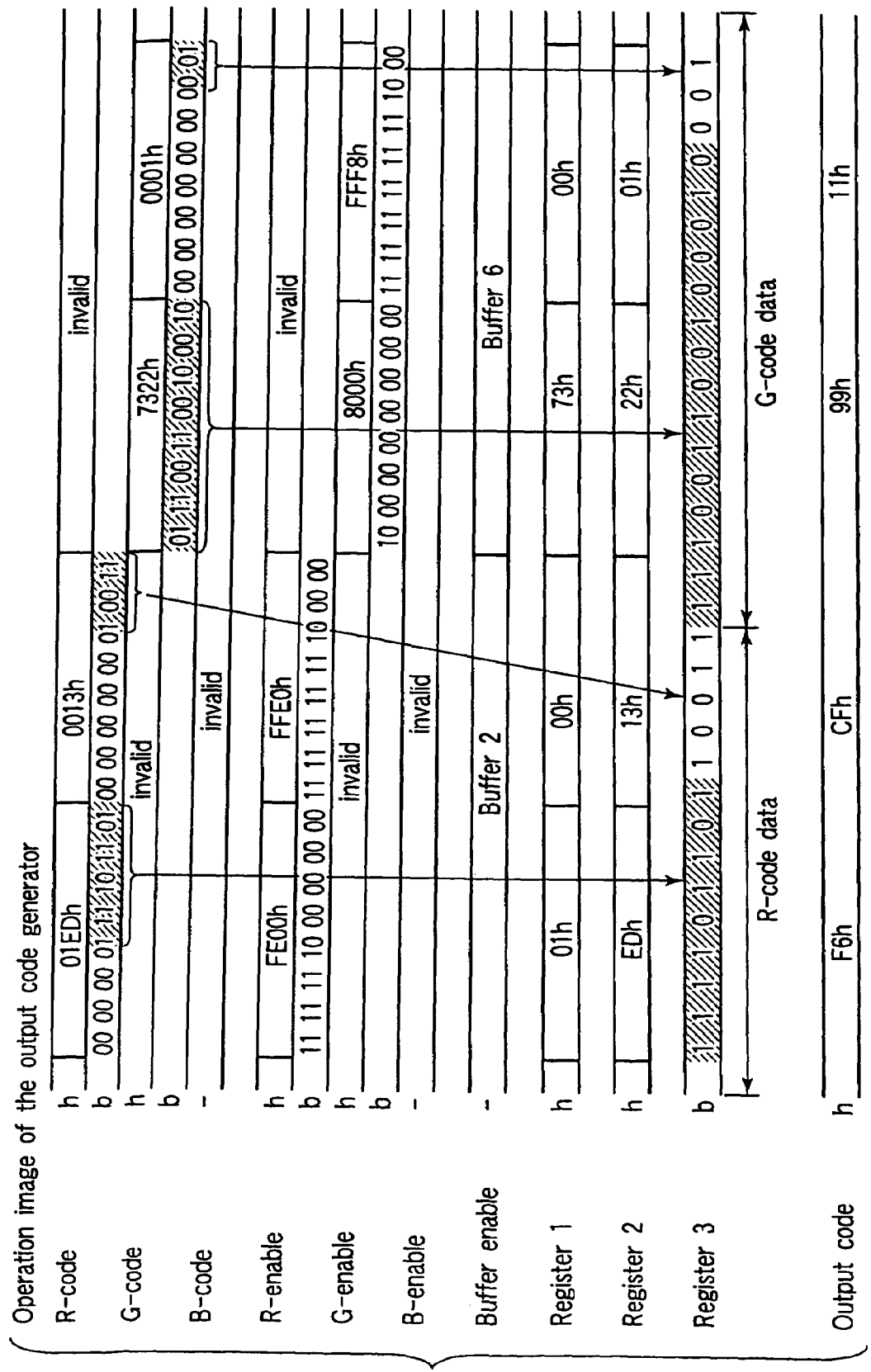
FIG. 2 is a timing chart showing an operation image of an output code generator.

An embodiment of the present invention will be explained with reference to the accompanying drawings. The code processing circuit of this embodiment has three encoders that encode red (R), green (G) and blue (B) data inputs and output encoded data in units of 8 bits (1 byte).

A code processing circuit 100 is configured as shown in FIG. 1.

The code processing circuit 100 comprises a first coder 1 which is a circuit to encode R-data, a buffer 2 which is a R-code storing circuit to store the R-code encoded by the first coder, a buffer 3 which is a R-code length storing circuit to store the data length of the encoded R-code, and a first adder 4 which is a R-code length adding circuit to add the R-code length. This structure is provided also for G-data and B-data. Namely, a second coder 5, a buffer 6 to store G-code, a buffer 7 to store the length of G-code, and a second adder 8 are provided for the G-data. A third coder 9, a buffer 10 to store B-code, a buffer 11 to store the length of B-code, and a third adder 12 are provided for the B-data. Different data of the same size is sequentially applied to the coders 1, 5 and 9, and the code and code length of each data are quite different except accidentally same.

The code processing circuit 100 comprises further a fourth adder 13, a ratio unit 14, and an adjustment unit 15.

The fourth adder 13 is a RGB code length adding circuit which adds all of the R-code length, G-code length and B-code length added by the adders 4, 8 and 12, and calculates a total added value.

The ratio unit 14 is a circuit to output the ratio of the R-code length, G-code length and B-code length. The ratio unit 14 comprises a radio calculator 14a, a ratio setting unit 14b, a selector 14c or a switching unit, and a use ratio selector 14d. The ratio calculator 14a calculates the ratio of the R/G/B code lengths from the code length added by the adders 4, 8 and 12 and the code lengths added by the fourth adder 13. The ratio of the code lengths of R/G/B data is previously set in the ratio setting unit 14b. The selector 14c selects one of the ratio calculated by the radio calculator 14a and the ratio set in the ratio setting unit 14b, and outputs the selected ratio. The use ratio selector 14d determines which is effective, the ratio set in the ratio calculator 14a or the ratio set in the ratio setting unit 14b, by controlling the selection of the selector 14c, for example, based on ON/OFF of an external switch of the unit in which the code processing circuit 100 is provided.

The adjustment unit 15 is a circuit to adjust the output code data by the unit of 1 bit, based on the code stored in the buffers 2, 6 and 10, the code lengths stored in the buffers 3, 7 and 11, and the code length added by the fourth adder 13. The adjustment unit 15 comprises a specified code length memory 15a, a code length comparator 15b, an enable signal generator 15c, and an output code generator 15d.

The code length comparator 15b compares the code length stored in the specified code length memory 15a, which sets the allowable code length of the code length of an output code data to be outputted as a specified code length, with the total added value calculated by the fourth adder 13. The enable signal generator 15c generates an effective code signal indicating an effective color code, based on the code lengths of R/G/B colors added by the adders 4, 8 and 12, the ratio of R/G/B codes outputted from the ratio unit 14, and the comparison result of the code length comparator 15b. The output code generator 15d generates output code data from the R/G/B codes and effective code signal generated by the enable signal generator 15c.

Hereinafter, explanation will be given on the flow of data processing in the code processing circuit 100 configured as described above. First, the R-data is applied to and encoded by the first coder 1. The code and code length outputted from the first coder 1 are stored in the buffers 2 and 3. In this time, the R-code data applied to the buffers 2 and 3 is assumed to be R-code, and the data length of the R-code is assumed to be R-code length. The R-code length is applied to the first adder 4 as well as stored in the buffer 3, and is added by the first adder 4. This added R-code length is assumed to be R-added value. Then, the same operation is performed for the G-data. In this time, the code outputted from the second coder 5 is assumed to be G-code, the length of the G-code data of the G-code is assumed to be G-code length, and the G-code length added by the second adder 8 is assumed to be G-added value. Further, the same operation is performed for the B-data. In this time, the code outputted from the third coder 9 is assumed to be B-code, the length of the B-code data of the B-code is assumed to be B-code length, and the B-code length added by the third adder 12 is assumed to be B-added value.

The adders 4, 8 and 12 outputs the R-added value, G-added value and B-added value to the fourth adder 13 and ratio calculator 14a to grasp the total length of all R/G/B codes. The code length of the whole R/G/B data can be grasped by the fourth adder 13. The total of the added values of the R/G/B code lengths added by the fourth adder 13 is assumed to be a total added value. This total added value is outputted to the ratio calculator 14a.

The ratio calculator 14a calculates the ratio of the R-code length, G-code length and B-code length from the R-added value, G-added value, B-added value and total added value. For example, the ratio of each code length is calculated by (R-added value/total added value):(G-added value/total added value):(B-added value/total added value). The ratio calculated as above is outputted to the selector 14c. The ratio of R/G/B code lengths set in the ratio setting unit 14b is also outputted to the selector 14c. It is permitted to set the ratio in the ratio setting unit 14b by specifying the ratio by a control unit of the unit in which the code processing circuit 100 is provided. It is also permitted to set a plurality of ratios and specify the ratio by the control unit. As described above, two kinds of ratio are inputted to the selector 14c. One of the ratios is outputted to the adjustment unit 15 based on the selection by the use ratio selector 14d.

Then the code length comparator 15b compares the total added value inputted from the adder 13 and the specified code length stored in the specified code length memory 15a. If the total added value is equal to or less than the specified code length, bits are not cut off for the R/G/B codes. If the total added value is greater than the specified code length, bits are cut off to make the R/G/B codes lower than the specified code length. The method of cutting off the R/G/B codes will be described later.

The enable signal generator 15c generates a R-enable signal, G-enable signal and B-enable signal, which are effective code signals indicating an effective color code, based on the code lengths inputted from the buffers 3, 7 and 11, as a result of comparing the code length and the ratio inputted from the ratio unit 14. The output code generator 15d generates output code data, based on the enable signals of each color generated by the enable signal generator 15c. FIG. 2 is a timing chart showing a part of the operation image of the output code generator 15d.

In FIG. 2, the codes of each color indicate the 16-bit code data of each color, and the enable signal of each color indicate indicates the 16-bit signal corresponding to the R/G/B codes. The enable signal of each color indicates "0", the color code corresponding to that color becomes effective. A buffer enable signal indicates that an effective buffer is one of the buffers 2, 6 and 10. A register R1 stores high order 8 bits of code data of an effective buffer, a register R2 stores low order 6 bits of code data of an effective buffer, and a register R3 stores an effective code of code data. An output code indicates an 8-bit output code data.

As shown in the drawing, at first, the buffer enable signal selects the buffer 2, and read the R-code from the buffer 2, and stores the high order 8 bits of the R-code in the register R1 and the low order 6 bits in the register R2. From the R-enable signal corresponding to the read R-code, store the effective code of the R-code in the register R3. When the buffer enable signal is changed to the buffer 6, an effective buffer is changed from the buffer 2 to buffer 6. Then, read the B-code from the buffer 6. Thereafter, the same process as reading the R-code is executed, and an output code is created.

Next, an explanation will be given on the processing of the adjustment unit 15. The adjustment unit 15 adjusts the R/G/B codes based on the R/G/B code lengths, the total added value and the ratio, at the following timing. For example, a coding end flag (R-coding end signal, G-coding end signal, B-coding end signal) is notified from each coder 1, 5 and 9, and when all the flags are notified, the adjustment unit 15 adjusts the R/G/B codes.

Next, diagrammatic explanation will be given on the method of accommodating each color code by the unit of bit with reference to FIG. 3 to FIG. 7.

When all coding end flags are notified, the code length comparator 15b compares the total added value inputted from the fourth adder 13 with the specified code length value stored in the specified code length memory 15a.

Figure 3:
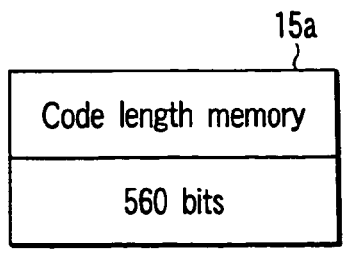
FIG. 3 is a diagram showing an example of the number of bits stored in a code length memory.

First, assume that 560 bits are stored in the specified code length memory 15a, and the total added value equal to or less than 560 bits, as shown in FIG. 3. As an example of a total added value that is equal to or less than 560 bits, there is a case of 550 bits consisting of 180-bit R-code, 60-bit G-code, and 310-bit B-code, as shown in FIG. 4.

In this case, the total added value is within 560 bits, and three code lengths can be outputted as they are. It is however necessary to consider that the unit of output code data is bytes. Since the added value of each color code length is known, the R-added value 180 is divided by 8. According to the result of division, 4 bits are left for the R-code by the unit of byte, and a 4-bit data is added from the G-code when outputting the codes. Next, subtract 4 bits added to the R-code from the G-added value 60, and divide 56 by 8. This can be divided, and the last code data of the G-code is 1-byte 8th data. In this way, the output code data can be created by the unit of bit without adding a dummy data.

Figure 4:
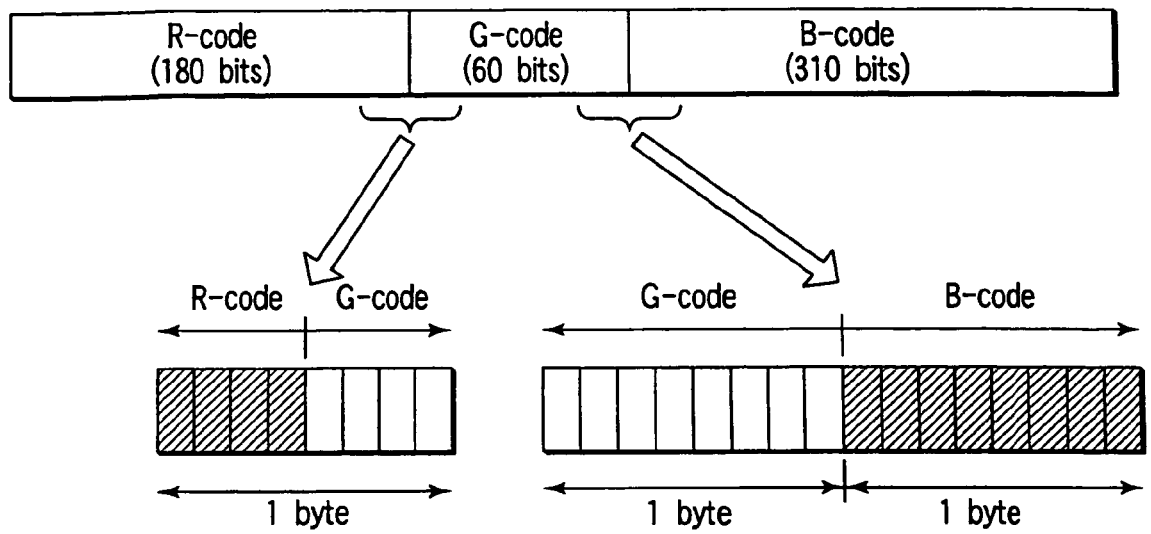
FIG. 4 is a diagram for explaining adjustment by bits.
Figure 5:
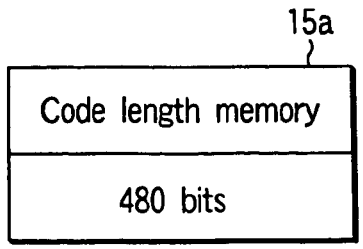
FIG. 5 is a diagram showing another example of the number of bits stored in a code length memory.

If 480 bits are stored in the specified code length memory 15a, as shown in FIG. 5, and the total added value is 550 bits like the code of R/G/B color shown in FIG. 4, the code of 70 bits or more must be cut off. In this case, the number of bits to cut off is calculated first. The ratio outputted from the ratio unit 14 is used for cutting off the number of bits. When the ratio inputted from the ratio unit 14 is the ratio calculated by the ratio calculator 14a, the ratio of code lengths of each color is approximately R:G:B=3:1:5, when calculated by using the above-mentioned equation. Therefore, the number of R-code bits to cut off is about 24 bits (=70/9*3), the number of G-code bits to cut off is about 8 bits (=70/9*1), and the number of B-code bits to cut off is about 39 bites (=70/9*5).

Figures 6, 7:
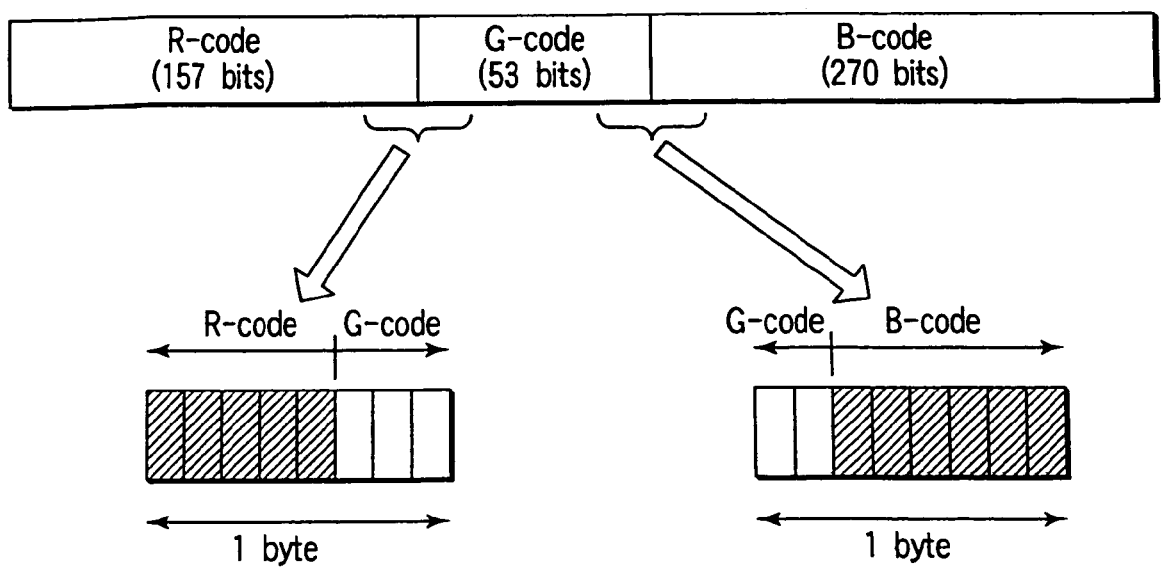
FIG. 6 is a diagram showing bit cut-off.
FIG. 7 is a diagram for explaining adjustment by bits after bit cut-off.

When the R/G/B color codes are configured as shown in FIG. 6, the number of bits is selected to cut off 70 or more bits based on the above-mentioned calculated cut off number. For the R-code, the Nth (10 bits), N-1st (4 bits), N-2nd (9 bits) are selected, and the cut-off bit number is 23 bits. For the G-code, Nth (7 bits) is selected, and the cut-off bit number is 7 bits. For the B-code, Nth (3 bits), N-1st (8 bits), N-2nd (4 bits), N-3rd (8 bits), N-4th (5 bits), N-5th (12 bits) are selected, and the cut-off bit number is 40 bits. The total of the cut-off bit numbers is 70 bits, and the cut-off bit can be set to 70 or more.

Therefore, the output R-code is 157 bits, the G-code is 53 bits, and B-code is 270 bits. The code processing circuit 100 grasps the code lengths of each code, and can make optimum cut-off. After the above-mentioned cutting off, adjustment of the output codes of each color of R/G/B by bits is performed as shown in FIG. 7.

When the R-code length 157 is divided by 8, 5 bits are left. Thus, add a 3-bit data and output by the unit of 1 byte from the G-code on. When the 3 bits added to the R-code is subtracted from the G-code 53 bits and 50 are divided by 8, 2 bits are left. A 6-bit data is added when outputting the B-code on. Thus, even if bits are cut off in the case when the total added value is longer than the specified code length, the output code data can be created by bits without adding a dummy data.

Further, when a remainder occurs when dividing the B-code length by 8, add the bits equivalent to the remainder to the codes from the next R-code on stored in the buffer 2. The next R-code means the R-data of the next R/G/B data block encoded by the first coder 1. In this configuration, it is possible not to add a dummy data even between the R/G/B data blocks. Thus, for example, when the code processing circuit 100 is provided in a scanner to read a color image, the data can be outputted without adding a dummy data when processing large quantities of R/G/B data blocks to be read in. It is unnecessary to add a dummy data to the R/G/B data blocks as well as between the R/G/B codes. This makes it possible to reduce largely the output code data.

In the above-mentioned embodiments, the R/G/B data is used as different kinds of data, but the invention is applicable also to the other kinds of data than the R/G/B data.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A code processing circuit comprising:
   a plurality of coders which encode red data, green data and blue data, respectively;
   a first buffer which stores the codes outputted from the coders provided corresponding to said plurality of coders;
   a second buffer which stores the lengths of the codes outputted from the coders provided corresponding to said plurality of coders;
   a first adder which adds the code lengths stored in the second buffer provided corresponding to said plurality of coders;
   a second adder which adds all the code lengths added in the first adder;
   an adjustment unit which adjusts an output code by the unit of 1 bit based on the codes stored in the first buffer, the code lengths stored in the second buffer and the code lengths added in the second adder, the output code being encoded red data, encoded green data and encoded blue data which are continuously output by the unit of 1 byte; and
   a ratio unit which calculates the ratio of the codes outputted from said plurality of coders based on an amount of the red data, the green data and the blue data,
   wherein the adjustment unit cuts off the codes based on the ratio, when the value of the code lengths added in the second adder is larger than the output unit stored in the code length memory,
   wherein the cut-off amount of the codes for the red data, the green data and the blue data is in accordance with the ratio,
   wherein the ratio unit has a ratio calculator which calculates the ratio of each code length according to the code lengths added in the first adder and the code lengths added in the second adder,
   wherein the ratio unit has a ratio setting unit which previously sets the ratio of each code length added in the first adder, and a switching unit which switches and outputs one of the ratio set in the ratio setting unit and the ratio calculated by the ratio calculator, and
   wherein the ratio unit has a use ratio selector for providing a predetermined use ratio value to the switching unit, wherein the adjustment unit has an enable signal generator which generates a plurality of different kinds of effective code signals based in part on the code lengths stored in the second buffer and based in part on the one ratio output by the switching unit, and wherein the adjustment unit further has an output code generator which generates output codes by the unit of 1 bit from the codes stored in the first buffer and the effective code signals generated by the enable signal generator.

* * * * *